US012751285B2

(12) United States Patent
Guillon et al.

(10) Patent No.: US 12,751,285 B2

(45) Date of Patent: Sep. 29, 2026

(54) METHOD FOR MANUFACTURING AND MODULE OF A SEMICONDUCTOR POWER MODULE WITH HEAT DISSIPATION FUNCTION

(71) Applicant: Hitachi Energy Ltd, Zürich (CH)

(72) Inventors: David Guillon, Vorderthal (CH); Martin Bayer, Oberentfelden (CH); Andreas Roesch, Murg (DE); Giovanni Salvatore, Gorizia (IT); Fabian Fischer, Baden (CH)

(73) Assignee: HITACHI ENERGY LTD, Zürich (CH)

( * ) Notice: Subject to any disclaimer, the term of this patent is extended or adjusted under 35 U.S.C. 154(b) by 545 days.

(21) Appl. No.: 18/029,020

(22) PCT Filed: Apr. 28, 2022

(86) PCT No.: PCT/EP2022/061344

§ 371 (c)(1),
(2) Date: Mar. 28, 2023

(87) PCT Pub. No.: WO2023/208348

PCT Pub. Date: Nov. 2, 2023

(65) Prior Publication Data

US 2024/0063080 A1 Feb. 22, 2024

(51) Int. Cl.

*H10W 40/22* (2026.01)
*H10W 70/68* (2026.01)
(Continued)

(52) U.S. Cl.

CPC ......... *H10W 40/22* (2026.01); *H10W 40/228* (2026.01); *H10W 72/071* (2026.01);
(Continued)

(58) Field of Classification Search

CPC ............. H01L 23/49811; H01L 23/142; H01L 23/053; H01L 23/36–3738; H01L 21/60;
(Continued)

(56) References Cited

U.S. PATENT DOCUMENTS

| | | | |
|---|---|---|---|
| 7,256,353 | B2 | 8/2007 | Osanai et al. |
| 7,983,046 | B1 | 7/2011 | Borzabadi et al. |

(Continued)

FOREIGN PATENT DOCUMENTS

| | | | |
|---|---|---|---|
| CN | 201812810 | U | 4/2011 |
| CN | 104701277 | A | 6/2015 |

(Continued)

*Primary Examiner* — Davienne N Monbleau
*Assistant Examiner* — Heim Kirin Grewal
(74) *Attorney, Agent, or Firm* — PROCOPIO, CORY, HARGREAVES & SAVITCH LLP

(57) ABSTRACT

A semiconductor power module comprises a metal substrate structure with a metal top layer, a metal bottom layer, and a dielectric layer in between. A housing with a top wall and side walls is coupled to the metal substrate structure. With respect to a stacking direction, there is a predetermined distance between a lower surface of the top wall and an upper surface of the metal top layer adjacent to the side walls. At least one terminal is arranged inside the housing, and is coupled to the lower surface of the top wall and to the upper surface of the metal top layer. With respect to the stacking direction, a length of the terminal is configured in coordination with the distance, such that due to the terminal, the metal substrate structure is bent in a predetermined manner and comprises a convex shape in interaction with the housing and the terminal.

20 Claims, 4 Drawing Sheets

Figure 1:
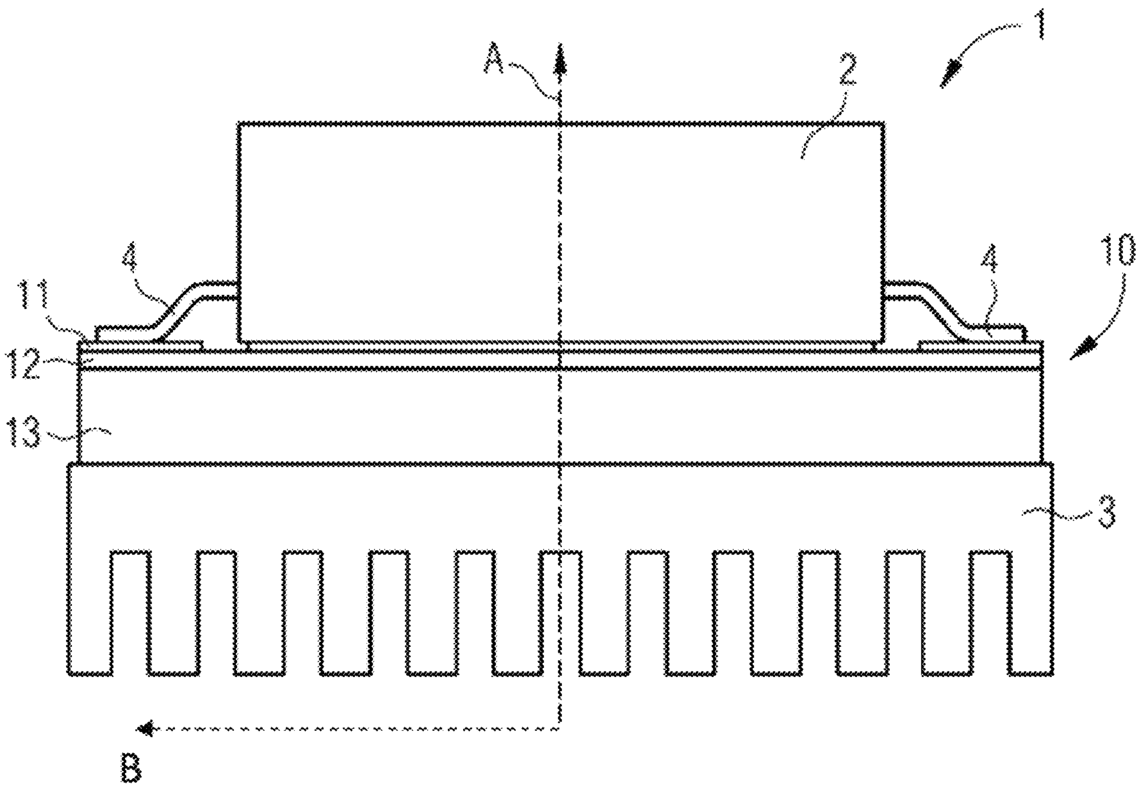

(51) Int. Cl.
*H10W 72/00* (2026.01)
*H10W 76/15* (2026.01)
*H10W 90/00* (2026.01)

(52) U.S. Cl.
CPC ......... *H10W 76/15* (2026.01); *H10W 90/701* (2026.01); *H10W 70/6875* (2026.01)

(58) Field of Classification Search
CPC ........ H01L 2224/48091; H10W 40/22; H10W 40/228; H10W 72/071; H10W 76/15; H10W 90/701; H10W 70/6875
See application file for complete search history.

(56) References Cited

U.S. PATENT DOCUMENTS

| | | | | |
|---|---|---|---|---|
| 2005/0035445 | A1 | 2/2005 | Manz et al. | |
| 2005/0230820 | A1 | 10/2005 | Licht | |
| 2006/0150751 | A1 | 7/2006 | Stolze | |
| 2007/0145536 | A1 | 6/2007 | Nystrom et al. | |
| 2007/0202721 | A1 | 8/2007 | Stolze et al. | |
| 2008/0101032 | A1 | 5/2008 | Tschirbs et al. | |
| 2009/0039498 | A1 | 2/2009 | Bayerer | |
| 2009/0261472 | A1 | 10/2009 | Bayerer | |
| 2010/0038758 | A1* | 2/2010 | Stolze | H01L 25/07 438/106 |
| 2010/0078807 | A1* | 4/2010 | Schulz | H01L 23/367 257/713 |
| 2016/0351460 | A1* | 12/2016 | Wan | H01L 23/16 |
| 2018/0184538 | A1* | 6/2018 | Bayerer | H05K 7/2039 |
| 2021/0257284 | A1* | 8/2021 | Uezato | H01L 23/49811 |
| 2021/0272874 | A1* | 9/2021 | Spann | H01L 23/041 |

FOREIGN PATENT DOCUMENTS

| | | | |
|---|---|---|---|
| CN | 108010904 | A | 5/2018 |
| CN | 208589435 | U | 3/2019 |
| CN | 110098159 | A | 8/2019 |
| CN | 211719576 | U | 10/2020 |
| DE | 4001554 | A1 | 7/1991 |
| DE | 19615481 | A1 | 10/1997 |
| DE | 102011004541 | A1 | 8/2012 |
| DE | 102015221062 | A1 | 5/2017 |
| DE | 102016119631 | A1 | 8/2017 |
| EP | 1083599 | A2 | 3/2001 |
| JP | H0758282 | A | 3/1995 |
| JP | H08-204071 | A | 8/1996 |
| JP | H10-012812 | A | 1/1998 |
| JP | 2009-44152 | A | 2/2009 |
| JP | 2010-212620 | A | 9/2010 |
| JP | 2017-228811 | A | 12/2017 |
| JP | 2018-022757 | A | 2/2018 |
| JP | 2018-067655 | A | 4/2018 |

* cited by examiner

METHOD FOR MANUFACTURING AND MODULE OF A SEMICONDUCTOR POWER MODULE WITH HEAT DISSIPATION FUNCTION

CROSS-REFERENCE TO RELATED APPLICATIONS

The present application is a national stage entry of International Patent Application No. PCT/EP2022/061344, filed on Apr. 28, 2022, which is hereby incorporated herein by reference as if set forth in full.

The present disclosure is related to a semiconductor power module and a corresponding manufacturing method for a semiconductor power module.

Conventional insulated metal substrates form technology for low and medium power semiconductor packages with low insulation requirements and low thermal resistance requirements simultaneously. Coolers are used for heat dissipation and it is a challenge to contribute to efficient heat dissipation.

Embodiments of the present disclosure can provide a semiconductor power module with an insulated metal substrate structure that enables efficient heat dissipation and reliable functioning even for high voltage power module applications. Further embodiments of the present disclosure can provide a manufacturing method for such a semiconductor power module.

According to an embodiment, a semiconductor power module comprises an insulated metal substrate structure with a metal top layer, a metal bottom layer, and a dielectric layer. The dielectric layer is coupled to both the metal top layer and the metal bottom layer and is arranged in between with respect to a stacking direction of the metal substrate structure. The semiconductor power module further comprises a housing configured to enclose electronics of the semiconductor power module. The electronics may include chips, especially power semiconductor devices, integrated circuits and/or other devices discrete devices or sensors. The housing comprises a top wall and side walls and may comprise a U-shape or pot-shape. The housing is coupled to the metal substrate structure, for example by means of its side walls. The housing and the metal substrate structure are directly or indirectly coupled to each other such that with respect to the stacking direction there is a predetermined distance between a lower surface of the top wall and an upper surface of the metal top layer adjacent to the side walls, respectively. The semiconductor power module further comprises at least one terminal that is arranged inside the housing or between the housing and the metal substrate structure. The least one terminal is coupled to the lower surface of the top wall on the one hand and to the upper surface of the metal top layer on the other hand. With respect to the stacking direction the at least one terminal has a length that is configured in coordination with the distance between the lower surface of the top wall and the upper surface of the metal top layer adjacent to the side walls. The length of at least one terminal is configured such that due to the at least one terminal the metal substrate structure is bent in a predetermined manner and comprises a convex shape of its backside in interaction with the housing.

Due to the described configuration of the housing, the metal substrate structure and the one or more terminals in between a semiconductor power module is feasible that provides a proper thermal interface and enables efficient heat dissipation and reliable functioning even for high voltage power module applications and even for large sized modules.

The housing and the at least one terminal expose compressive load on the top side or upper surface of the metal substrate structure. Thus, a pre-bent insulated metal substrate is feasible due to the specific lengths of the side walls and the one or more terminals configured in coordination with each other and the convex bow of a backside thus formed contributes to a proper thermal contact between the metal substrate structure and a cooler.

According to an embodiment, a total length including the length of the at least one terminal is given such that in the direction towards the metal top layer the at least one terminal protrudes beyond the distance or beyond a length of the side walls or a respective side walls portion by at least 0.5 mm. Formulated alternatively, the total length is larger by 0.5 mm or more than the distance between the lower surface of the top wall and the upper surface of the metal top layer, respectively. Thus, the one or more terminals can have a specific longer length than portions of the housing compared with a distance between a module cover and the upper surface of the insulated metal substrate in relaxed state before mounting of housing block.

The respective length of the at least one terminal and the side walls can refer to a respective section of the terminal or the side walls or to a complete length of the associated element along the stacking direction. Due to the fact that the at least one terminal is formed deliberately longer than the corresponding length of the side wall, the metal substrate structure bends outwards away from the housing resulting in a convex shape of a backside of the metal substrate structure. For example, edge or lateral areas of the metal substrate structure connected to the side walls of the housing are pulled or pressed towards the housing due to the coupling and/or are fixedly connected with the side walls of the housing, e.g. by gluing or screwing, whereas the one or more terminals expose a compressive load on the metal substrate structure that pushes a middle section of the metal substrate structure away from the housing.

The length of the at least one terminal can also be configured in coordination with adjacent elements which add up to the total length that is larger than the aforementioned predetermined distance between a lower surface of the top wall and an upper surface of the metal top layer. For example, there can be an additional element or protrusion on the upper surface of the metal top layer and/or on the lower surface of the top wall. Therefore, the length of the terminal itself can be longer but does not have to be longer than the distance between the top wall and the metal top layer.

For example, if there is no additional element or protrusion between the terminal and the top wall and/or between the terminal and the metal top layer, the length of the terminal is larger than the aforementioned distance and longer than a length of the respective side walls portion between the lower surface of the top wall and the upper surface of the metal top layer. In such a case, with respect to a direction towards the metal top layer the at least one terminal protrudes beyond the distance or the length of the side walls or side wall portions and causes a bend of the insulated metal substrate structure and a convex shape at its backside when joining housing with terminals and metal substrate structure together.

According to an embodiment of the semiconductor power module, the housing and the metal substrate structure are coupled to each other by means of at least one of screwing, gluing, clamping and sealing or any other applicable coupling method. For example, a sealing can be arranged between the side walls or a frame part of the housing and the metal substrate structure. For example, the housing and/or the metal bottom layer comprise respective screw holes to enable screwing connections. Thus, the housing and the metal substrate structure can be coupled to each other by means of screwing connections, which are positioned in a respective area or part or portion adjacent to the side walls of the housing.

According to a further embodiment of the semiconductor power module, the housing is formed by means of molding, for example by means of injection molding, transfer molding and/or compression molding. The one or more terminals are integrally coupled to and partially embedded in the molded housing. The molded housing can be made of thermoplastic resin or thermosetting resin. For example, the housing is made of epoxy resin. The material of the housing can also comprise fillers such as particles, fibers and/or chemical additives.

According to a further embodiment of the semiconductor power module, the at least one terminal is connected to the lower surface of the top wall and/or to the upper surface of the metal top layer by means of at least one of clamping, soldering, welding, gluing and sintering. Alternatively or additionally, other applicable joining methods are possible.

It is a finding in the context with the present disclosure that conventional insulated metal substrates may have a risk of formation of a cavity due to concave bow of the metal substrate backside between a baseplate and cooler surface which drastically reduces the thermal performance of a corresponding power module. A conventional insulated metal substrate is typically flat before power module assembly and hence there is a risk that the insulated metal substrate will have a strong unwanted concave bow of a backside after module assembly, making this baseplate type unusable for power modules with a large footprint. A backside of an originally flat insulated metal substrate can have a strong concave bow of a few hundred microns after soldering of chips to the insulated metal substrate due to thermal mismatch between silicon chips and metal sheets and the mechanical setup of the insulated metal substrate, for example.

Due to the described pre-bent metal substrate structure it is possible to provide a predetermined convex shape of a baseplate backside. In view of a preliminary stage, for example chips are soldered to the metal substrate structure causing concave bow, the described configuration of the semiconductor power module (over)compensates or counteracts the concave bow. Thus, the described semiconductor power module configuration enables to prevent the formation of a cavity between baseplate and cooler surface, when it is mounted to a cooler unit or a heat sink. Thus, a very even and large-surface contact between a bottom surface of the metal substrate structure and a heat sink is feasible resulting in a proper thermal interface between the metal substrate structure and the heat sink. Especially, there is reliable thermal contact formed in the center of the metal substrate structure due to convex bow of its backside or bottom surface. Due to the pressure exposed by the terminals the substrate can get flat, when mounting the semiconductor power module to the cooler, but then pressure is exposed especially in the center, which prevents formation of cavity. In addition, the convex bow and consequently a proper thermal interface can be still available during module operation, which can contribute to an improved reliability.

According to a further embodiment, the semiconductor power module comprises two or more terminals arranged inside the housing and coupled to the lower surface of the top wall on the one hand and to the upper surface of the metal top layer on the other hand. The two or more terminals may have different lengths with respect to the stacking direction between the lower surface and the upper surface. In the following, the present disclosure is described in the context of a plurality of terminals. For example, the semiconductor power module comprises three or four or five terminals. However, features and characteristics of two or more terminals are also disclosed with respect to the semiconductor power module comprising only one terminal and vice versa.

According to a further embodiment of the semiconductor power module, the terminals or respective elongated parts of the terminals are arranged symmetrically inside the housing along a lateral direction perpendicular to the stacking direction and with respect to a middle axis or a symmetry plane of the semiconductor power module.

According to a further embodiment of the semiconductor power module, the terminals can comprise a spring or stress relief structure configured to expose pressure or to compensate too strong mechanical stress on the metal substrate structure or a respective terminal feet in a predetermined manner.

According to a further embodiment, the semiconductor power module comprises a cushion element that is coupled to the at least one terminal configured to expose pressure on the terminal and/or the metal substrate structure in a predetermined manner. The cushion element may be arranged on the top wall of the housing and can expose pressure from the top. Possibly, cushion element can be arranged between a top side of the housing and the respective terminal. A height of the terminal may be the sum the height of the terminal itself and the cushion element.

According to a further embodiment of the semiconductor power module, the terminals comprise a respective elongated terminal body and a respective plate-shaped terminal foot with a contact surface that contacts or faces the upper surface of the metal substrate structure. The terminal foot may directly contact the metallization pattern or the metal top layer or the contact surface of the terminal foot may be covered partially or completely with a coating comprising one or more layers of at least one of gold, silver and nickel. Also the complete terminal can be coated.

According to a further embodiment, the semiconductor power module comprises a heat sink that is coupled to a bottom surface of the metal bottom layer to dissipate heat during operation of the semiconductor power module. The semiconductor power module can comprise a separate heat sink, for example having fins or ribs. Alternatively or additionally, the metal bottom layer of the metal substrate structure can act as a heat sink itself and can be configured to comprise pin-fins, ribs or protrusions, for example, to provide a beneficial heat dissipation. The metal bottom layer can further act as a baseplate of the semiconductor power module. The semiconductor power module including the metal substrate structure can be further partly or completely encapsulated by resin prepared by molding or potting or dielectric gel. Even for a hard filling material, the described setup or configuration of the semiconductor power module can help to provide and keep a needed bow during and after encapsulation process.

The described configurations of the semiconductor power module enables mounting of a housing block, where power and/or auxiliary terminals can be an integral part of the housing block, to an insulated metal substrate consisting of a metal base, an isolating resin sheet, and a circuit metallization realized by the metal substrate structure. The one or more terminals are specifically designed to expose compressive load on the insulated metal substrate resulting in a convex bow of at least a part of a backside of the metal substrate structure.

According to an embodiment, a method for manufacturing a semiconductor power module comprises providing metal substrate structure, a housing and at least one terminal as described above. Thus, the at least one terminal has a given length with respect to the stacking direction that is larger, for example by at least 0.5 mm, than the length of the side walls of the housing. The method further comprises coupling the at least one terminal, the housing and the metal substrate structure together such that the at least one terminal is arranged inside the housing and coupled to a lower surface of the top wall on the one hand and coupled to an upper surface of the metal top layer on the other hand. Thereby the one or more terminals provide a compressive load on the metal substrate structure such that the metal substrate structure is bent in a predetermined manner and comprises a convex shape of the bottom surface or backside of the metal substrate structure in interaction with the housing and the at least one terminal.

As a result of that the described method enables the manufacturing of an embodiment of the aforementioned semiconductor power module, described features and characteristics of the semiconductor power module are also discloses for the manufacturing method and vice versa. Thus, the present disclosure comprises several aspects, wherein every feature described with respect to one of the aspects is also disclosed herein with respect to the other aspect, even if the respective feature is not explicitly mentioned in the context of the specific aspect.

According to an embodiment of the method, the step of coupling the terminals, the housing and the metal substrate structure together comprises forming the housing by means of molding such that the at least one terminal is integrally coupled to and partially embedded in the molded housing. The method further comprises coupling the molded housing and the embedded at least one terminal to the metal substrate structure by means of at least one of screwing, clamping, gluing and sealing.

According to an embodiment of the method the step of providing the metal substrate structure can comprise forming an insulated metal substrate by coupling the metal top layer with the dielectric layer and with the metal bottom layer. Thus, the method can comprise aligning the metal top layer, the dielectric layer and the metal bottom layer relative to each other, and laminating the metal top layer, the dielectric layer and the metal bottom layer.

Alternatively, the step of coupling the metal top layer with the dielectric layer and with the metal bottom layer comprises providing a molding substance, aligning the metal top layer and the metal bottom layer relative to each other with a predetermined distance in between, and then bringing in the provided molding substance between the aligned metal top layer and the metal bottom layer and thereby forming the dielectric layer by means of molding. The formation of the dielectric layer by means of molding can be done by injection molding, compression molding and/or transfer molding, for example.

Thus, the dielectric layer can realize a pre-preg sheet which is assembled between two metal plates on top and the bottom forming the metal top layer and the metal bottom layer. Such metallization sheets or plates are bonded to the insulation of the dielectric layer by the lamination process, for example. A required metallization structure of the metal top layer can then be done by subsequent steps of masking and etching processes to locally remove conductive metal, creating the final metallization structure.

With respect to a molded dielectric layer, the molding substance realizes a pumpable substance with predetermined material properties. The pumpable substance is a liquid or viscous raw material of the dielectric layer to be formed. For example, the molding substance is an epoxy and/or ceramic based liquid containing a heat conductive inorganic filler material comprising ceramic particles. Alternatively or additionally, the raw material of the dielectric layer may be a thermosetting or a thermoplastic resin material such as polyamide, PBT, PET. Alternatively or additionally, the raw material of the dielectric layer may comprise inorganic filler for improved thermal conductivity and/or CTE adjustment with respect to the metal top layer and/or the metal bottom layer. For example, the molded dielectric layer comprises a resin based dielectric material with ceramic filling material, e.g. epoxy, $Al_2O_3$, AlN, BN, $Si_3N_4$ or $SiO_2$. For example, the dielectric layer is an epoxy with filler. The dielectric layer can be also based on other materials suitable for transfer, injection or compression molding such as bismaleimide, cyanate ester, polyimide and/or silicones. Alternatively or additionally, the dielectric layer can include a ceramic material and/or hydroset material or a material combination of two or more of the aforementioned components. A thickness of the dielectric resin layer may have a value between 100-200 μm.

The aligning of the metal top layer and the metal bottom layer relative to each other with a predetermined distance in between will substantially predetermine the later thickness of the molded dielectric layer. For example, the alignment can be realized by placing the metal top layer onto a release film or liner or another fixation, for example in a mold chase of a molding tool. This enables to precisely position the provided metallization structure of the metal top layer relative to the metal bottom layer and can be useful if the metal top layer comprises separate metal pads due to different potentials of operation, for example. In case of lamination, a thickness of a resin layer is given by the thickness and the behavior of the laminated layer.

According to a further embodiment of the manufacturing method the metal top layer can be provided with a given metallization pattern by means of stamping. Alternatively or additionally, the metal top layer can be provided by means of etching and/or cutting, for example. Alternatively or additionally, the metal top layer is formed with a predetermined structure by means of laser cutting of a provided metal sheet, for example.

The metallization of the metal top layer can be formed out of a film and/or a sheet comprising copper and/or aluminum and/or an alloy of copper and/or an alloy of aluminum. This can also apply to the metal bottom layer which can be formed as a copper and/or aluminum plate and/or a corresponding alloy, for example. The metal top layer can comprise a coating of the circuit metallization. Such a coating may be one or more layers made of or comprise nickel, gold, silver and/or other metals. A thickness of the circuit metallization or the metal top layer may have a value between 150-500 μm.

The one or more terminals may act as power terminals or as auxiliary terminals, e.g. used for signal wiring. The one or more terminals can be made of or comprise cooper or copper alloy. The one or more terminals can comprise a coating at a bottom surface of one or more layers made of or comprising nickel, gold, silver and/or other metals. Alternatively or additionally, further parts or the complete terminals can be coated. The one or more terminals are specifically designed for application of compressive load. The terminals have a length, which is larger by at least 0.5 mm compared with the distance between the lower surface of the housing module cover and the upper surface of insulated metal substrate in relaxed state before mounting of the housing block. The length of individual terminals may be different. The housing may be formed as a molded block comprising a shape with a pre-bending or curved or protruding structure that can support the compressive load exposed by the terminals.

The proposed use of a housing block realized by the housing, where terminals expose pressure or compressive load to the insulated metal substrate realized by the metal substrate structure makes this comparably cost-effective substrate technology interesting for large power modules and power modules for higher voltage classes. For example, this enables manufacturing of the semiconductor power module with a lateral side length or width of 34 mm times 100 mm or even up to 140 mm times 190 mm. In this respect, the lateral side length or width extends in lateral directions perpendicular to the stacking direction of the semiconductor power module.

Due to the exposal of pressure, the backside of the insulated metal substrate has the correct convex bow orientation even after the complete semiconductor power module assembly, which is beneficial for a proper thermal interface between the semiconductor power module and the cooler or the heat sink. After mounting to a cooler, the substrate is getting nearly flat, but then pressure is exposed to the metal substrate structure by the one or more longer terminals to prevent formation of cavities especially in the center region.

The described configurations of the semiconductor power module allows for a significant cost-down, when replacing a standard setup of ceramic substrates being soldered to a baseplate by an insulated metal substrate realized by the metal substrate structure. On the one hand, material costs can be reduced, and on the other hand several process steps like the joining process between a substrate and a baseplate in the semiconductor power module assembly can be removed from a process flow. Additionally, the use of a screwed connection between the housing and the insulated metal substrate can save the need of gluing of the module housing to the insulated metal substrate.

Figure 2:
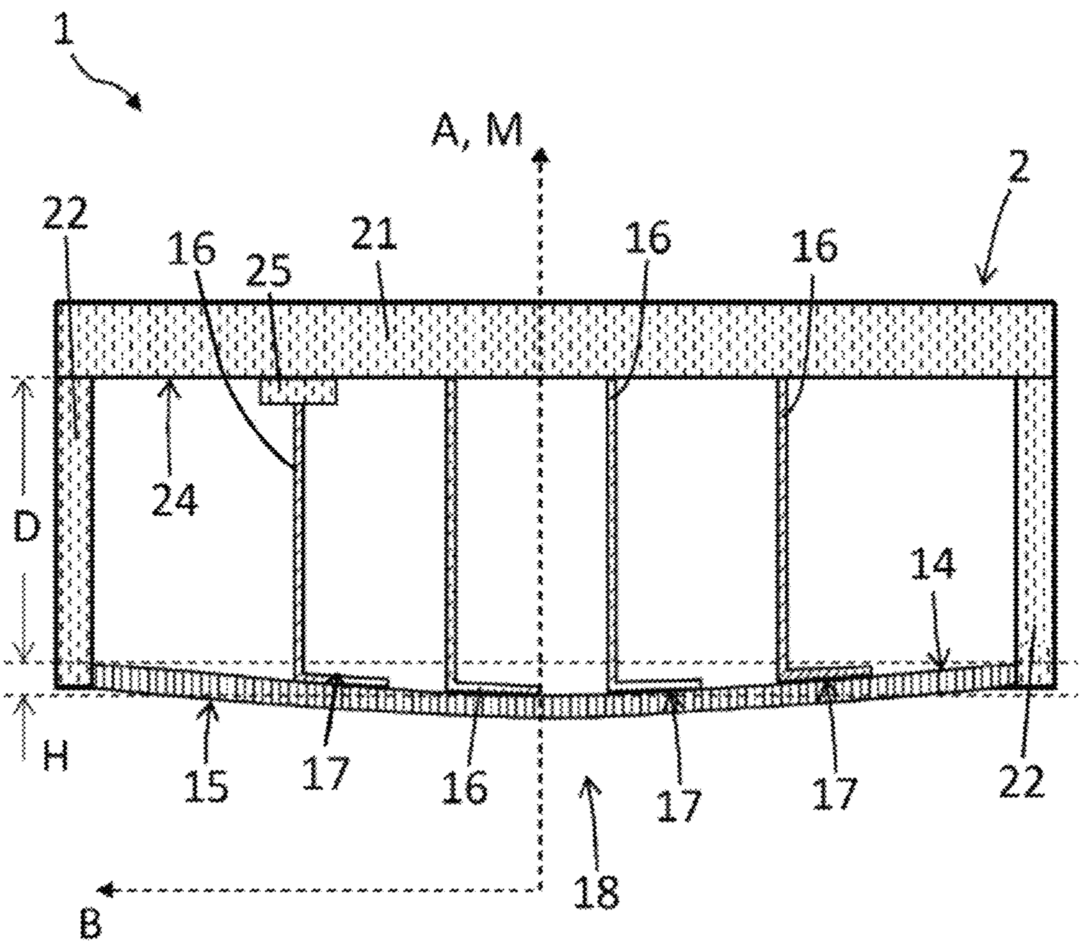
Figure 3:
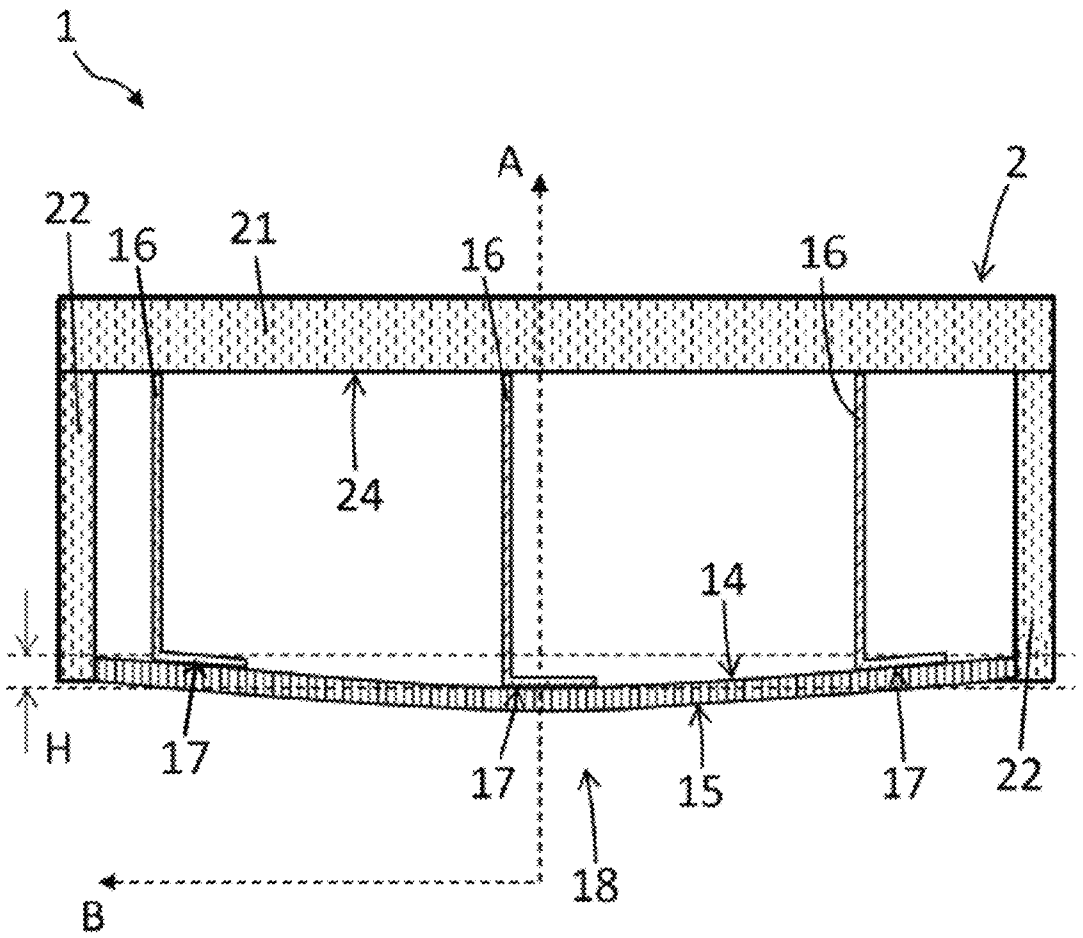
Figure 4:
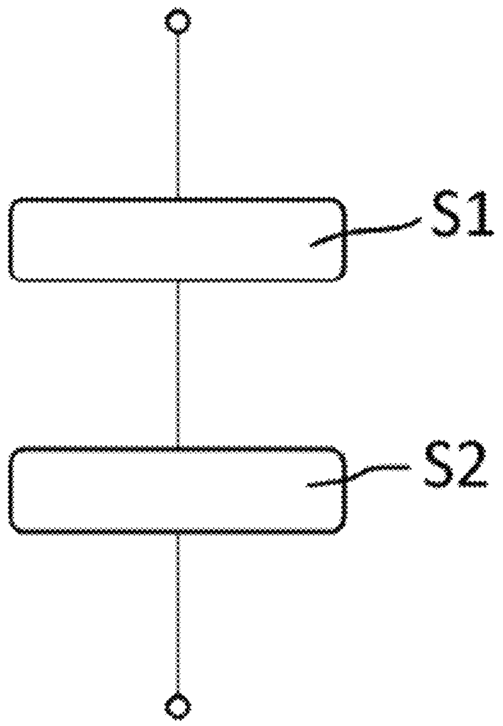

Exemplary embodiments are explained in the following with the aid of schematic drawings and reference numbers. The figures show:

FIG. 1 embodiment of a semiconductor power module in a schematic side view;

FIGS. 2-3 embodiments of the semiconductor power module in schematic cross section views; and FIG. 4 a flow chart for a method for manufacturing an embodiment of the semiconductor power module.

The accompanying figures are included to provide a further understanding. It is to be understood that the embodiments shown in the figures are illustrative representations and are not necessarily drawn to scale. Identical reference numbers designate elements or components with identical functions. In so far as elements or components correspond to one another in terms of their function in different figures, the description thereof is not repeated for each of the following figures. For the sake of clarity elements might not appear with corresponding reference symbols in all figures possibly.

FIG. 1 illustrates a side view of an embodiment of a semiconductor power module 1 for a semiconductor device. According to further embodiments, the semiconductor power module 1 can comprise alternative forms as the one shown in FIG. 1. The semiconductor power module 1 comprises a metal substrate structure 10 that realizes an insulated metal substrate. The semiconductor power module 1 further comprises electronics which is coupled with the metal substrate structure 10, and a heat sink 3 which is coupled with the metal substrate structure 10 as well. The electronics can include chips, especially power semiconductor devices, for example. With respect to an illustrated stacking direction A the electronics are coupled with an upper surface 14 of a metal top layer 11 of the metal substrate structure 10 (see FIGS. 2 and 3). The heat sink 3 is coupled with a bottom surface 15 of a metal bottom layer 13 of the metal substrate structure 10. The metal substrate structure 10 further comprises a dielectric layer 12 formed between the metal top layer 11 and the metal bottom layer 13.

Both, the metal top layer 11 and the metal bottom layer 13 consist of metal or at least comprise metal such as copper and/or aluminum and/or a corresponding alloy, for example. Alternative thermally and/or electrically conductive materials or material combinations can be used instead. The dielectric layer 12 is a pre-preg sheet or a molded epoxy resin with filler, for example. The filler can be ceramic like or realized by other inorganic filler like glass fibers. Alternatively or additionally, the dielectric layer 12 can comprise thermoplastic or thermosetting resin such as polyamide, PBT and/or PET. Alternatively or additionally, the dielectric layer 12 comprises a ceramic based insulation layer such as Al2O3, AlN, BN, Si3N4, SiO2. The dielectric layer 12 can also be based on other materials suitable for injection molding, transfer molding and/or compression molding such as bismaleimide, cyanate ester, polyimide and silicones, or might be even based on ceramic materials, such as hydroset materials. Thus, the metal substrate structure 10 realizes an insulated metal substrate with a structured topside metallization, a metal back side plate and a dielectric insulation layer in between. Pads of the metal top layer 11 are connected to components of the electronics via leads 4 and/or via terminals 16 which are coupled with the metal top layer 11 by means of welding or soldering, for example.

The illustrated semiconductor power module 1 can realize a gel- or resin-filled power module, wherein the electronics or even the whole top side or even more of the metal substrate structure 10 can be embedded in or covered by an epoxy resin, thermoplastic or other thermosetting resin and/or gel encapsulation. Such an encapsulation can be done by means of molding afterwards to the manufacturing of the metal substrate structure 10, for example. Potting or molding can be done after mounting of chips and mounting of the resin housing, e.g. with incorporated terminals or separately mounted terminals. Options of preparation of the semiconductor power module 1 can comprise filling with a gel, filling with an epoxy resin by means of injection molding, transfer molding and/or other molding methods, or potting.

The FIGS. 2-3 show different embodiments of the semiconductor power module 1 in schematic side and/or cross section views.

The semiconductor power module 1 comprises the metal substrate structure 10 and a housing 2 configured to enclose the electronics of the semiconductor power module 1 and the metal substrate structure 10. The housing 2 comprises a top wall 21 and side walls 22 and is coupled to the metal substrate structure 10 by means of its side walls 22 and by means of screwing, clamping and/or gluing and can comprise a sealing between the side walls 22 and the metal substrate structure 10. If screwing connections are used, the screwing connections can be positioned in a respective area adjacent to the side walls 22 of the housing 2 and spaced apart from a middle section 18 of the metal substrate structure 10. The housing 2 can be formed by molding made of epoxy resin or using any of a thermoplastic resin or a thermosetting resin, for example. The housing 2 can form the aforementioned encapsulation of the semiconductor power module 1 or can form an additional cover for the metal substrate structure 10. The housing 2 can be formed in one piece or can be made of two or more parts, for example comprising a frame that provides the side walls 22, and a cover that provides the top wall 21.

The semiconductor power module 1 further comprises at least one terminal 16 that is arranged inside the housing 2. According to the embodiment illustrated in FIG. 2, the semiconductor power module 1 comprises four terminals 16. According to the embodiment illustrated in FIG. 3, the semiconductor power module 1 comprises three terminals 16. With respect to a middle axis M or a symmetry plane which is located at the center the terminals 16 or their elongated parts are arranged symmetrically inside the housing 2 along a lateral direction B perpendicular to the stacking direction A. Alternatively, the terminal feet can be arranged symmetrically. However, the terminals 16 can also be arranged not symmetrically.

The terminals 16 are coupled to a lower surface 24 of the top wall 21 on the one hand and coupled to an upper surface 14 of the metal top layer 11 on the other hand. The terminals 16 each comprise an elongated terminal body and a plate-shaped terminal foot with a contact surface 17 that contacts the upper surface 14 of the metal substrate structure 10. Alternatively, there can be a joining layer arranged between the contact surface 17 of one or more terminals 16 and the upper surface 14. The joining layer can be made of or can comprise glue, solder and/or sinter material, for example.

The terminals 16 can be connected to the upper surface 14 by means of soldering, gluing, sintering, ultrasonic welding, laser welding and/or another welding and/or joining process. An upper portion of the elongated terminal body of the terminals 16 can be integrally coupled to the top wall 21 embedded in the molded housing 2. A dry or pressure contact or a clamping of the terminals 16 and the housing 2 is possible too. Alternatively or additionally, the elongated terminal body of the terminals 16 can be connected to the top wall 21 by another joining method or it can be connected with a horizontal terminal portion located on the bottom side or lower surface 24 of the top wall 21.

The housing 2 and the metal substrate structure 10 are coupled such that with respect to the stacking direction A there is a predetermined distance D between a lower surface 24 of the top wall 21 and the upper surface 14 of the metal top layer 11 adjacent to the side walls 22, respectively. The terminals 16 are configured to comprise a specific length or height. For example, at least one terminal 16 comprises a length that is larger than a length of a corresponding side wall portion in proximity to the side walls 22, respectively.

For example, the length of one or more terminals 16 is at least 0.5 mm larger than the one of the side walls 22 or the distance D. The length and the distance D refer to a direction along the stacking direction A. The length of the respective terminal 16 is defined substantially by a length of the elongated terminal body between the lower surface 24 of the top wall 21 and the upper surface 14 of the metal top layer 11. The compared length of the side walls 22 is also related to a section of the respective side wall 22 between the lower surface 24 of the top wall 21 and the upper surface 14 of the metal top layer 11 and/or a bottom surface of the side walls 22 at outer edge areas where the side walls 22 and the metal substrate structure 10 are coupled. As indicated in the FIGS. 2 and 3 the terminals 16 closer to the edge areas may have a smaller length than the terminal(s) 16 in the middle section 18 or closer to the middle. Thus, at least one terminal 16 in the middle section or closer to the middle 18 comprises a length that is larger by at least 0.5 mm than a length of the side walls 22. At least one terminal of the terminals 16 but not necessarily all terminals 16 can have a length of at least 0.5 mm more than the length of the side walls 22.

Thus, due to the one or more terminals 16 being longer than the side walls 22 a compressive load is exposed on the metal substrate structure 10 such that it is bent in a predetermined manner and comprises a convex shape of the substrate backside in interaction with the housing 2 and the terminals 16. The middle section 18 of the metal substrate structure 10 is therefore pressed outwards and a resulting bending height H is formed between a height level of the upper surface 14 at the edge areas and a height level of the upper surface 14 in the middle section 18. Depending on the length of the terminals 16 the bending height H can have a value of 0.5 mm or more, wherein a length and/or width of the metal substrate structure 10 along the lateral direction B and a corresponding further lateral direction can have values of 34 mm times 100 mm or 140 mm times 190 mm, for example.

Such a pre-bent metal substrate structure 10 and its predetermined convex shape enables to provide the semiconductor power module 1 that can prevent a formation of a cavity due to concave bow of the substrate backside between the bottom surface 15 and an upper surface of the heat sink 3. Thus, the described configurations of the metal substrate structure 10 and the semiconductor power module 1 can take into account by means of pre-compensation that there is any distortion during assembling. Thus, a very even and large-surface contact between the bottom surface 15 of the metal substrate structure 10 and an upper surface of the heat sink 3 is feasible resulting in a proper thermal interface between the metal substrate structure 10 and the heat sink 3. This allows for an improved heat dissipation during operation of the semiconductor power module 1. The thermal interface can also be thinner in the center due to the applied compressive load and the corresponding convex bow of the substrate backside resulting in better heat dissipation and an enhanced reliability during operation can be achieved, especially, when the compressive load is also still available during module operation.

However, the length of at least one terminal 16 itself can be longer but does not have to be longer than the distance D between the top wall 21 and the metal top layer 11. Alternatively or additionally, there can be an additional element or protrusion 25 on the upper surface 14 of the metal top layer 11 and/or on the lower surface 24 of the top wall 21 as exemplary illustrated in FIG. 2. The element or protrusion 25 can be formed in one piece with the top wall 21 or can realize a separate part. Alternatively or additionally, there can be an additional element, e.g. a chip, a metal platelet, an auxiliary substrate, or joining material, or protrusion between the terminal 16 and the metal top layer 11 formed in one piece with the metal top layer 11 or formed as a separate part.

Thus, with respect to the stacking direction A the at least one terminal 16 has a length that is configured in coordination with the distance D between the lower surface 24 of the top wall 21 and the upper surface 14 of the metal top layer 11 adjacent to the side walls 22. The length of at least one terminal 16 can be configured in coordination with one or more elements or protrusions 25 such that the at least one terminal 16 contributes to a bend and a convex shape of the metal substrate structure 10 in a predetermined manner. As a result and with respect to a relaxed state of the assembled semiconductor power module 1, a distance in the middle section 18 is bigger than the distance D outside in proximity to the sidewalls 22.

Steps of a corresponding manufacturing method can follow the flow chart as shown in FIG. 4. In a step S1 the metal substrate structure 10, the housing 2 and the terminals 16 can be formed and/or provided. At least one terminal 16 has a given length with respect to the stacking direction A that contributes to a total length larger by at least 0.5 mm than the corresponding length of the side walls 22 of the housing 2.

In a step S2 the terminals 16, the housing 2 and the metal substrate structure 10 are coupled together such that the terminals 16 are arranged inside the housing 2 and coupled to the lower surface 24 of the top wall 21 on the one hand and to the upper surface 14 of the metal top layer 11 on the other hand. Thereby the terminals 16 provide a compressive load on the metal substrate structure 10 such that it is bent in a predetermined manner and a convex shape of the substrate backside or the bottom surface 15 is formed in interaction with the housing 2 and the terminal 16.

The terminals 16 can be made from copper or a copper alloy and can realize auxiliary or main terminals. A thickness of the terminals 16 can have a value of 0.2 mm up to 3.0 mm with respect to the lateral direction B and/or the stacking direction A. This may apply to both the upright terminal body portion and/or the horizontal terminal foot portion of the L-shaped terminals 16, respectively. Horizontal and vertical sections may have equal or different thicknesses.

The described embodiments of the semiconductor power module 1 provides an opportunity to form a convex bow of the backside of an insulated metal substrate structure 10 even after the complete module assembly process. An improvement of the reliability during module operation can be achieved by exposal of compressive load on the center of the baseplate, so that the convex bow or at least a flat backside remains during long-term operation. The semiconductor power module 1 can comprise an integrated structure of module housing 2 and the terminals 16, where the respective terminal feet expose pressure or compressive load on the insulated metal substrate structure 10, so that the pressure provides a convex bow of the backside or bottom surface 15. The integrated structure of module housing 2 and the terminals 16 can be realized as one piece or building block forming a terminal or housing block. Thus, the terminals 16 can be formed as an integral part of such a housing block. The housing 2 can be screwed, clamped, or glued to the insulated metal substrate structure 10, so that the design of the housing block allows a compressive load on the metal substrate structure 10.

The housing 2 is typically fixed to the insulated metal substrate structure 10 by screwed connections. In such a case, corresponding screw holes are available in the insulated metal substrate structure 10 and/or the housing 2. Nevertheless, other methods of mounting are possible like gluing or clamping. In the case of screwing or clamping, a sealing between module housing 2 and the insulated metal substrate structure 10. The sealing can be used for sealing a remaining gap between the housing 2 and the metal substrate structure 10, so that the semiconductor power module 1 can be filled with gel or resin being liquid in process without leakage. Such a sealing material can comprise a rubber sealing or other elastic material.

The described compressive load on the upper surface 14 of the insulated metal substrate structure 10 can be applied by the terminals 16 by following design options, for example:

- Terminals 16 may have a length, which is at least 0.5 mm larger than the distance between the module cover or top wall 21 and the upper surface 14 of insulated metal substrate structure 10 in a relaxed state before mounting of the housing 2. Here, the length of the terminals 16 may be different with respect to their positions in the semiconductor power module 1 and the corresponding bow of the insulated metal substrate structure 10.
- Compressive load may be provided by a corresponding design of the housing 2, which may be realized e.g. by a pre-bending of the housing block or by curved or protruding structures.
- The terminals 16 may incorporate a spring or stress relief structure which provides pressure on the respective terminal feet with a better defined amount of pressure.
- Additional cushion elements can expose pressure on terminal parts with better defined amount.

The insulated metal substrate structure 10 can be formed by stamping the metal top layer 11 to have a predetermined metallization pattern, a backside metal sheet and a molded dielectric resin layer 12. Thus, the insulated metal substrate structure 10 can be formed as a stamped and molded metal substrate, SMMS. Alternatively, the metal substrate structure 10 can be formed by laminating and etching of the metal top layer 11. The housing 2, which can form a power module housing consisting of a frame and a cover portion, incorporates the power and auxiliary terminals 16. The housing 2 can be formed from one piece or two or more separate parts depending on design. An integral structure can be prepared by any kind of molding process like transfer or injection molding of resin material embedding at least an upper part of the respective terminal bodies of the terminals 16. Miscellaneous resin materials like epoxy resin and/or another thermosetting resin, or thermoplastic resin are considerable. The resin material may contain any kind of filler like particles or fibers, but also chemical additives e.g. for improved mechanical and/or thermal behavior. The connections between the respective terminal feet of the terminals 16 and the upper surface 14 of the insulated metal substrate structure 10 may be realized by miscellaneous joining processes like soldering, ultrasonic welding, laser welding, gluing, and/or sintering or other applicable processes. Also dry contacts are possible. The terminals 16 typically consist of copper or copper alloy, which may be coated e.g. by nickel for oxidation prevention.

The embodiments shown in the FIGS. 1 to 4 as stated represent exemplary embodiments of the improved metal substrate structure 10, the semiconductor power module 1 and the manufacturing method for; therefore, they do not constitute a complete list of all embodiments. Actual arrangements and methods may vary from the embodiments shown in terms of metal substrate structures and power modules, for example.

REFERENCE SIGNS

1 semiconductor power module
2 housing
21 top wall of the housing
22 side wall of the housing
24 lower surface of the top wall
25 element/protrusion
3 heat sink

4 leads
10 metal substrate structure
11 metal top layer
12 dielectric layer
13 metal bottom layer
14 upper surface of the metal substrate structure
15 bottom surface of the metal substrate structure
16 terminal
17 contact surface of the terminal
18 middle section of the metal substrate structure
A stacking direction
B lateral direction
D distance between the top wall and the metal top layer
M middle axis
H bending height
S(i) steps of a method for manufacturing a semiconductor power module

The invention claimed is:

1. A semiconductor power module, comprising:

a metal substrate structure with a metal top layer, a metal bottom layer, and a dielectric layer that is coupled to both the metal top layer and the metal bottom layer in between with respect to a stacking direction of the metal substrate structure, a housing configured to enclose electronics of the semiconductor power module, wherein housing comprises a top wall and side walls, sidewalls being coupled to the metal substrate structure such that with respect to the stacking direction there is a predetermined distance between a lower surface of the top wall and an upper surface of the metal top layer adjacent to the side walls, respectively and at least one terminal arranged inside the housing, wherein the at least one terminal is coupled to the lower surface of the top wall and coupled to the upper surface of the metal top layer, and wherein with respect to the stacking direction a length of at least one terminal is configured in coordination with the distance, wherein the length of the at least one terminal exceeds the predetermined distance between the lower surface of the top wall and the upper surface of the metal top layer, such that due to the at least one terminal the metal substrate structure is bent in a predetermined manner and comprises a convex shape in interaction with the housing, and wherein the metal substrate structure is bent outward away from the housing due to the length of the at least one terminal exceeding the predetermined distance.

2. The semiconductor power module according to claim 1, wherein a total length including the length of the at least one terminal is given such that in the direction towards the metal top layer the at least one terminal protrudes beyond the length of the side walls by at least 0.5 mm.

3. The semiconductor power module according to claim 2, wherein the housing and the metal substrate structure are coupled to each other by means of at least one of screwing, gluing, clamping, and sealing.

4. The semiconductor power module according to claim 3, wherein the housing and/or the metal bottom layer comprise respective one or more screw holes, and the housing and the metal substrate structure are coupled to each other by means of screwing connections, wherein the screwing connections are positioned in a respective area adjacent to the side walls of the housing.

5. The semiconductor power module according to claim 2, wherein the housing is formed by means of molding, and wherein the at least one terminal is integrally coupled to the top wall partially embedded in the molded housing.

6. The semiconductor power module according to claim 1, wherein the housing and the metal substrate structure are coupled to each other by means of at least one of screwing, gluing, clamping, and sealing.

7. The semiconductor power module according to claim 6, wherein the housing is formed by means of molding, and wherein the at least one terminal is integrally coupled to the top wall partially embedded in the molded housing.

8. The semiconductor power module according to claim 6, wherein the housing and/or the metal bottom layer comprise respective one or more screw holes, and the housing and the metal substrate structure are coupled to each other by means of screwing connections, wherein the screwing connections are positioned in a respective area adjacent to the side walls of the housing.

9. The semiconductor power module according to claim 8, wherein the housing is formed by means of molding, and wherein the at least one terminal is integrally coupled to the top wall partially embedded in the molded housing.

10. The semiconductor power module according to claim 1, wherein the housing is formed by means of molding, and wherein the at least one terminal is integrally coupled to the top wall partially embedded in the molded housing.

11. The semiconductor power module according to claim 1, wherein the at least one terminal is connected to the lower surface of the top wall and/or to the upper surface of the metal top layer by means of at least one of clamping, soldering, welding, gluing and sintering.

12. The semiconductor power module according to claim 1, comprising:

two or more terminals arranged inside the housing and coupled to the lower surface of the top wall and to the upper surface of the metal top layer, wherein the two or more terminals comprise different lengths with respect to the stacking direction between the lower surface and the upper surface.

13. The semiconductor power module according to claim 12, wherein with respect to a middle axis or a symmetric plane the two or more terminals are arranged symmetrically inside the housing along a lateral direction perpendicular to the stacking direction.

14. The semiconductor power module according to claim 1, wherein the at least one terminal comprises a spring or an elastic or a stress relief structure configured to expose pressure on the metal substrate structure in a predetermined manner.

15. The semiconductor power module according to claim 1, comprising:

a cushion element that is coupled to the at least one terminal configured to expose pressure on the terminal and/or the metal substrate structure in a predetermined manner.

16. The semiconductor power module according to claim 1, wherein the at least one terminal comprises an elongated terminal body and a plate-shaped terminal foot with a contact surface that contacts or faces the upper surface of the metal substrate structure.

17. The semiconductor power module according to claim 16, wherein the at least one terminal comprises copper or copper alloy, and the contact surface of the terminal foot and/or a contact portion of the upper surface of the metal top layer is covered with a coating comprising at least one layer of at least one of gold, silver and nickel for oxidation prevention.

18. The semiconductor power module according to claim 1, comprising:

a heat sink that is coupled to a bottom surface of the metal bottom layer.

19. A method for manufacturing a semiconductor power module, comprising:

providing metal substrate structure with a metal top layer, a metal bottom layer, and a dielectric layer that is coupled to both the metal top layer and the metal bottom layer in between with respect to a stacking direction of the metal substrate structure, providing a housing configured to enclose electronics of the semiconductor power module, wherein the housing comprises a top wall and side walls with given lengths, providing at least one terminal with a given length, and coupling the at least one terminal, the housing and the metal substrate structure together such that the side walls are coupled to the metal substrate structure and the at least one terminal is arranged inside the housing and coupled to a lower surface of the top wall and coupled to an upper surface of the metal top layer, wherein the length of at least one terminal is configured in coordination with a distance between the lower surface of the top wall and the upper surface of the metal top layer adjacent to the side walls, respectively, wherein the length of the at least one terminal exceeds the distance between the lower surface of the top wall and the upper surface of the metal top layer, and thereby providing a compressive load on the metal substrate structure due to the at least one terminal such that the metal substrate structure is bent in a predetermined manner and comprises a convex shape in interaction with the housing and the at least one terminal, and wherein the metal substrate structure is bent outward away from the housing due to the length of the at least one terminal exceeding the distance.

20. The method according to claim 19, wherein the coupling the at least one terminal, the housing and the metal substrate structure together, comprises:

forming the housing by means of molding such that the at least one terminal is integrally coupled to the top wall partially embedded in the molded housing, and coupling the molded housing and the embedded at least one terminal to the metal substrate structure by means of at least one of screwing, clamping, gluing, and sealing.

* * * * *